United States Patent
Lee et al.

(10) Patent No.: US 9,801,274 B2
(45) Date of Patent: Oct. 24, 2017

(54) LIGHT EMITTING DEVICE

(71) Applicant: Genesis Photonics Inc., Tainan (TW)

(72) Inventors: Hao-Chung Lee, Tainan (TW); Yu-Feng Lin, Tainan (TW); Meng-Ting Tsai, Tainan (TW)

(73) Assignee: GENESIS PHOTONICS INC., Tainan (TW)

(*) Notice: Subject to any disclaimer, the term of this patent is extended or adjusted under 35 U.S.C. 154(b) by 168 days.

(21) Appl. No.: 14/927,477

(22) Filed: Oct. 30, 2015

(65) Prior Publication Data

US 2016/0123568 A1 May 5, 2016

(30) Foreign Application Priority Data

Oct. 30, 2014 (TW) .............................. 103137684 A

(51) Int. Cl.
*H01L 33/62* (2010.01)
*H05K 1/05* (2006.01)
*H05K 1/02* (2006.01)
*H05K 3/34* (2006.01)

(52) U.S. Cl.
CPC ................ *H05K 1/05* (2013.01); *H01L 33/62* (2013.01); *H01L 2224/16225* (2013.01); *H01L 2924/15311* (2013.01); *H05K 1/0203* (2013.01); *H05K 3/3436* (2013.01); *H05K 2201/10106* (2013.01)

(58) Field of Classification Search
CPC ....... H01L 33/62; H01L 33/486; H01L 33/32; H01L 33/38
See application file for complete search history.

(56) References Cited

U.S. PATENT DOCUMENTS

2014/0273356 A1  9/2014 Truhitte et al.
2016/0197253 A1* 7/2016 Miyashita ............... H01L 33/62
                                                        257/89

FOREIGN PATENT DOCUMENTS

TW    201023313 A1   6/2010
TW    201203636 A1   1/2012
TW    201322510 A    6/2013
(Continued)

OTHER PUBLICATIONS

Cheng-Wei Hung et al., Title: Circuit Board for Driving Flip-Chip Light Emitting Chip and Light Emitting Module Comprising the same, pending U.S. Appl. No. 14/927,456, filed Oct. 29, 2015.

*Primary Examiner* — Quoc Hoang
(74) *Attorney, Agent, or Firm* — CKC & Partners Co., Ltd.

(57) ABSTRACT

A light emitting device includes a light source, a light source carrier and a circuit board. The circuit board is configured to provide power to the light source via the light source carrier. The circuit board includes a metal substrate having an upper surface, the upper surface including a first electrode area, a second electrode area and a heat conduction area; a first metal electrode formed on the first electrode area; a first insulation layer formed between the first metal electrode and the metal substrate; a second metal electrode formed on the second electrode area; a second insulation layer formed between the second metal electrode and the metal substrate; and a solder resist layer covering the upper surface of the metal substrate; wherein the heat conduction area is exposed from the solder resist layer, and the heat conduction area is connected to the light source carrier.

20 Claims, 5 Drawing Sheets

(56) References Cited

FOREIGN PATENT DOCUMENTS

| TW | 201417221 A | 5/2014 |
| TW | 201429009 A | 7/2014 |
| TW | 201438245 A | 10/2014 |

\* cited by examiner

LIGHT EMITTING DEVICE

BACKGROUND OF THE INVENTION

1. Field of the Invention

The present invention relates to a light emitting device, and more particularly, to a light emitting device capable of improving heat dissipation efficiency.

2. Description of the Prior Art

Since light emitting diodes (LEDs) have advantages of long service life, small size and low power consumption, the light emitting diodes are widely used in various kinds of illumination devices. Generally, when temperature of the light emitting diodes rises, light emitting efficiency of the light emitting diodes is significantly decreased and service life of the light emitting diodes is reduced as well. As the light emitting diodes are gradually used for various kinds of illumination devices, the heat dissipation problem of the light emitting diodes becomes more important.

In the prior art, a substrate for carrying light emitting diodes is made of aluminum oxide ($Al_2O_3$) or other materials with insulation and high heat-conductive characteristics, so as to dissipate heat of the light emitting diodes. However, thermal conductivity of the aluminum oxide is still lower than thermal conductivity of a metal material. Therefore, the prior art cannot further improve heat dissipation efficiency of a light emitting diode illumination device.

SUMMARY OF THE INVENTION

The present invention provides a light emitting device capable of improving heat dissipation efficiency, in order to solve the problems of the prior art.

The light emitting device of the present invention comprises a light source, a light source carrier and a circuit board. The light source has a first electrode and a second electrode. The light source carrier comprises an insulation substrate, with a first through hole and a second through hole formed on the insulation substrate; a first upper metal pad arranged on an upper surface of the insulation substrate and electrically connected to the first electrode; a second upper metal pad arranged on the upper surface of the insulation substrate and electrically connected to the second electrode; a first conductor arranged in the first through hole; a second conductor arranged in the second through hole; a first lower metal pad arranged on a lower surface of the insulation substrate and electrically connected to the first upper metal pad through the first conductor; a second lower metal pad arranged on the lower surface of the insulation substrate and electrically connected to the second upper metal pad through the second conductor; and a third lower metal pad arranged on the lower surface of the insulation substrate and not electrically connected to the first lower metal pad and the second lower metal pad. The circuit board comprises a metal substrate having an upper surface and a lower surface, the upper surface comprising a first electrode area, a second electrode area and a heat conduction area; a first metal electrode formed on the first electrode area for providing a first voltage to the first lower metal pad; a first insulation layer formed between the first metal electrode and the metal substrate; a second metal electrode formed on the second electrode area for providing a second voltage different from the first voltage to the second lower metal pad; a second insulation layer formed between the second metal electrode and the metal substrate; and a solder resist layer covering the upper surface of the metal substrate; wherein the heat conduction area is exposed from the solder resist layer, and the heat conduction area is connected to the third lower metal pad.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
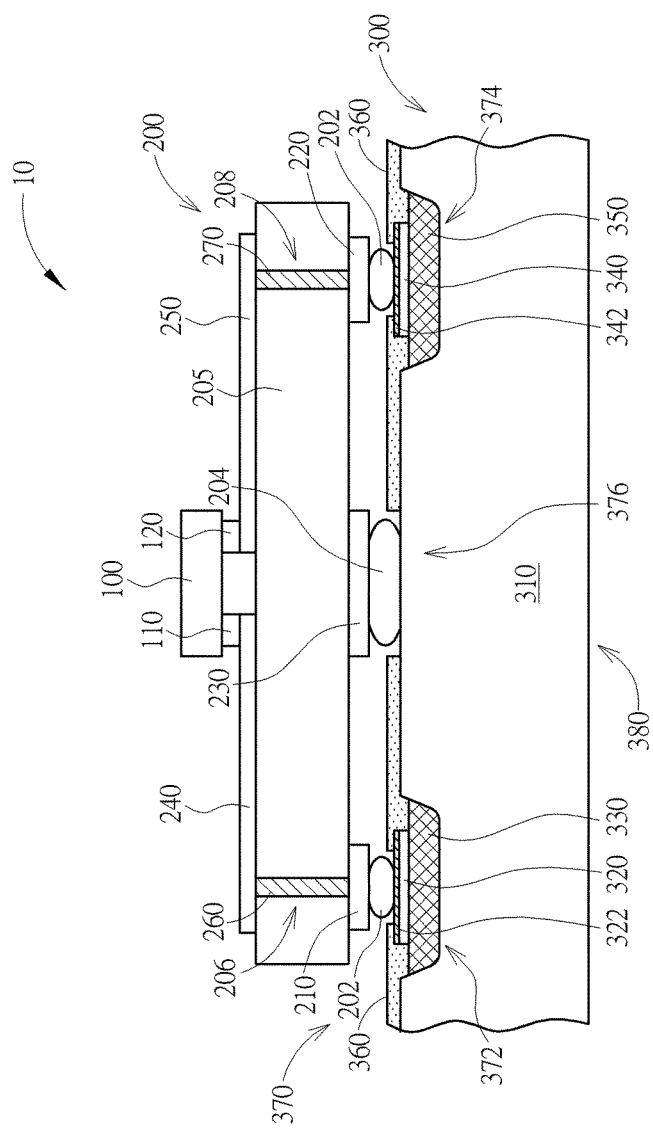
FIG. 1 is a diagram showing a light emitting device of the present invention.
Figure 2:
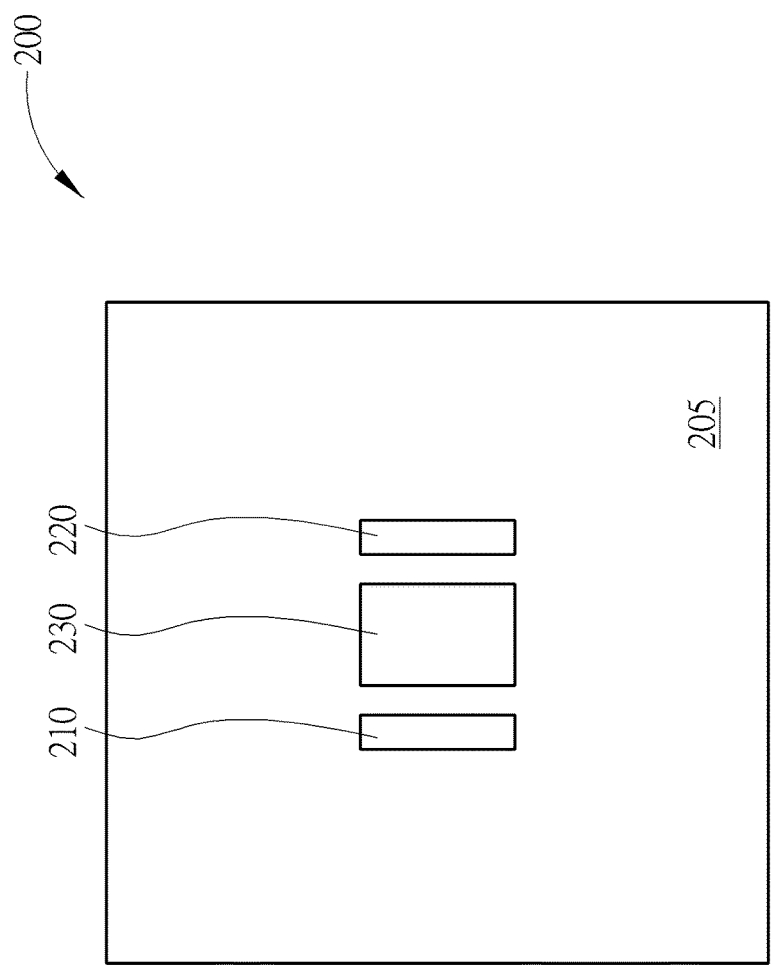
FIG. 2 is a diagram showing a lower surface of a light source carrier in FIG. 1.
Figure 3:
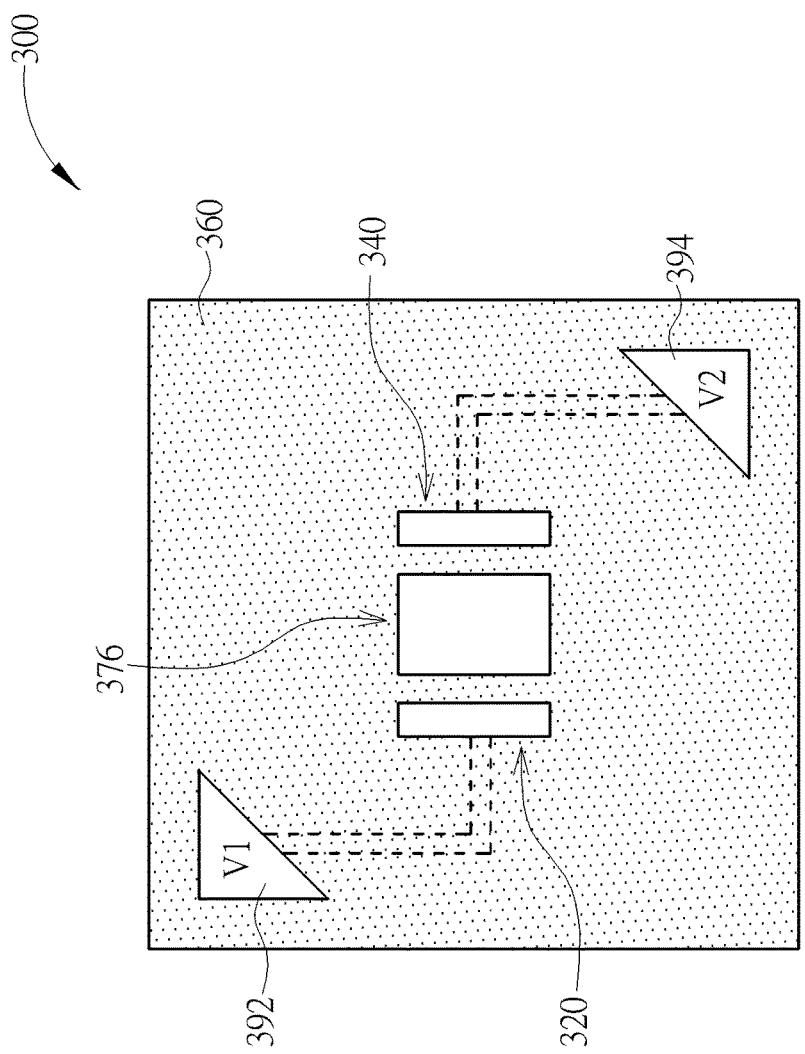
FIG. 3 is a diagram showing an upper surface of a circuit board in FIG. 1.

Please refer to FIG. 1 to FIG. 3. FIG. 1 is a diagram showing a light emitting device of the present invention. FIG. 2 is a diagram showing a lower surface of a light source carrier in FIG. 1. FIG. 3 is a diagram showing an upper surface of a circuit board in FIG. 1. As shown in figures, the light emitting device 10 of the present invention comprises a light source 100, a light source carrier 200 and a circuit board 300. The light source 100 has a first electrode 110 and a second electrode 120. The light source carrier 200 is configured to carry the light source 100. The light source carrier 200 comprises an insulation substrate 205, a first upper metal pad 240, a second upper metal pad 250, a first conductor 260, a second conductor 270, a first lower metal pad 210, a second lower metal pad 220, and a third lower metal pad 230. A first through hole 206 and a second through hole 208 are formed on the insulation substrate 205. The first upper metal pad 240 is arranged on an upper surface of the insulation substrate 205 and electrically connected to the first electrode 110. The second upper metal pad 250 is arranged on the upper surface of the insulation substrate 205 and electrically connected to the second electrode 120. The first conductor 260 is arranged in the first through hole 206. The second conductor 270 is arranged in the second through hole 208. The first lower metal pad 210 is arranged on a lower surface of the insulation substrate 205 and electrically connected to the first upper metal pad 240 through the first conductor 260. The second lower metal pad 220 is arranged on the lower surface of the insulation substrate 205 and electrically connected to the second upper metal pad 250 through the second conductor 270. The third lower metal pad 230 is arrange on the lower surface of the insulation substrate 205 and not electrically connected to the first lower metal pad 210 and the second lower metal pad 220.

The circuit board 300 comprises a metal substrate 310, a first metal electrode 320, a first insulation layer 330, a second metal electrode 340, a second insulation layer 350 and a solder resist layer 360. The metal substrate 310 has an upper surface 370 and a lower surface 380. The upper surface 370 comprises a first electrode area 372, a second electrode area 374 and a heat conduction area 376. The first electrode area 372 and the second electrode area 374 can be recessed areas formed by etching the upper surface 370, but the present invention is not limited thereto. The first metal electrode 320 is formed on the first electrode area 372. The first insulation layer 330 is formed between the first metal electrode 320 and the metal substrate 310, in order to prevent conduction between the first metal electrode 320 and the metal substrate 310. The second metal electrode 340 is formed on the second electrode area 374. The second insulation layer 350 is formed between the second metal electrode 340 and the metal substrate 310, in order to prevent conduction between the second metal electrode 340 and the metal substrate 310. Due to the arrangement of the first insulation layer 330 and the second insulating layer 350, the heat conduction area 376 is not electrically connected to the first metal electrode 320 and the second metal electrode 340. The solder resist layer 360 is formed to cover the upper surface 370 of the metal substrate 310. The solder resist layer 360 can prevent solder from flowing around, and has an insulation function. The heat conduction area 376 is exposed from the solder resist layer 360, and the heat conduction area 376 can be directly or indirectly connected to the third lower metal pad 230. For example, the heat conduction area 376 can be indirectly connected to the third lower metal pad 230 through a heat dissipation material (such as solder paste or heat dissipation paste), and thermal conductivity of the heat dissipation material is greater than 50 W/mk. In other embodiments of the present invention, the heat conduction area 376 can be directly connected to the third lower metal pad 230, that is, the heat conduction area 376 can directly contact the third lower metal pad 230.

In addition, as shown in FIG. 3, the circuit board of the present invention can further comprise a first power electrode 392 and a second power electrode 394. The first power electrode 392 can be electrically connected to the first metal electrode 320, and is configured to receive a first voltage V1 (such as a positive voltage). The second power electrode 394 can be electrically connected to the second metal electrode 340, and is configured to receive a second voltage V2 (such as a ground voltage) different from the first voltage V1. As such, the first metal electrode 320 can provide the first voltage V1 to the first lower metal pad 210 for further transmitting the first voltage V1 to the first electrode 110 of the light source 100, and the second metal electrode 340 can provide the second voltage V2 to the second lower metal pad 220 for further transmitting the second voltage V2 to the second electrode 120 of the light source 100, in order to drive the light source 100 to emit light.

According to the above arrangement, when the light source 100 emits light, heat generated by the light source 100 can be transmitted to the light source carrier 200, and the heat can be further transmitted to the heat conduction area 376 of the circuit board 300 through the third lower metal pad 230. Therefore, the heat generated by the light source 100 when emitting light can be rapidly guided to the metal substrate 310 by the heat conduction area 376, and the heat can be further dissipated by the metal substrate 310. In one embodiment of the present invention, the metal substrate 310 can be a copper substrate. Since thermal conductivity of copper is higher than thermal conductivity of aluminum oxide, the circuit board 300 of the present invention can improve heat dissipation efficiency. Moreover, the light source 100, the light source carrier 200 and the circuit board 300 are electrically connected with each other through the electrodes, thus the light emitting device 10 of the present invention does not need wire bonding for electrical connection.

On the other hand, the solder resist layer 360 can be made of a light reflective material for reflecting light emitted by the light source 100, such that light emitting efficiency of the light emitting device 10 can be improved. In one embodiment of the present invention, the light source 100 can be a flip-chip light emitting chip or an encapsulated light source, but the present invention is not limited thereto. Moreover, the circuit board 300 of the present invention can further comprise a first anti-oxidative metal layer 322 formed on the first metal electrode 320, and a second anti-oxidative metal layer 342 formed on the second metal electrode 340. The first anti-oxidative metal layer 322 and the second anti-oxidative metal layer 342 can be made of gold or silver, in order to prevent the first metal electrode 320 and the second metal electrode 340 from being oxidized.

In the above embodiment, the light emitting device 10 of the present invention only comprises one light source 100. However, in other embodiments of the present invention, the light emitting device of the present invention can comprise a plurality of light sources arranged on the light source carrier and electrically connected in series and/or in parallel.

Figure 4:
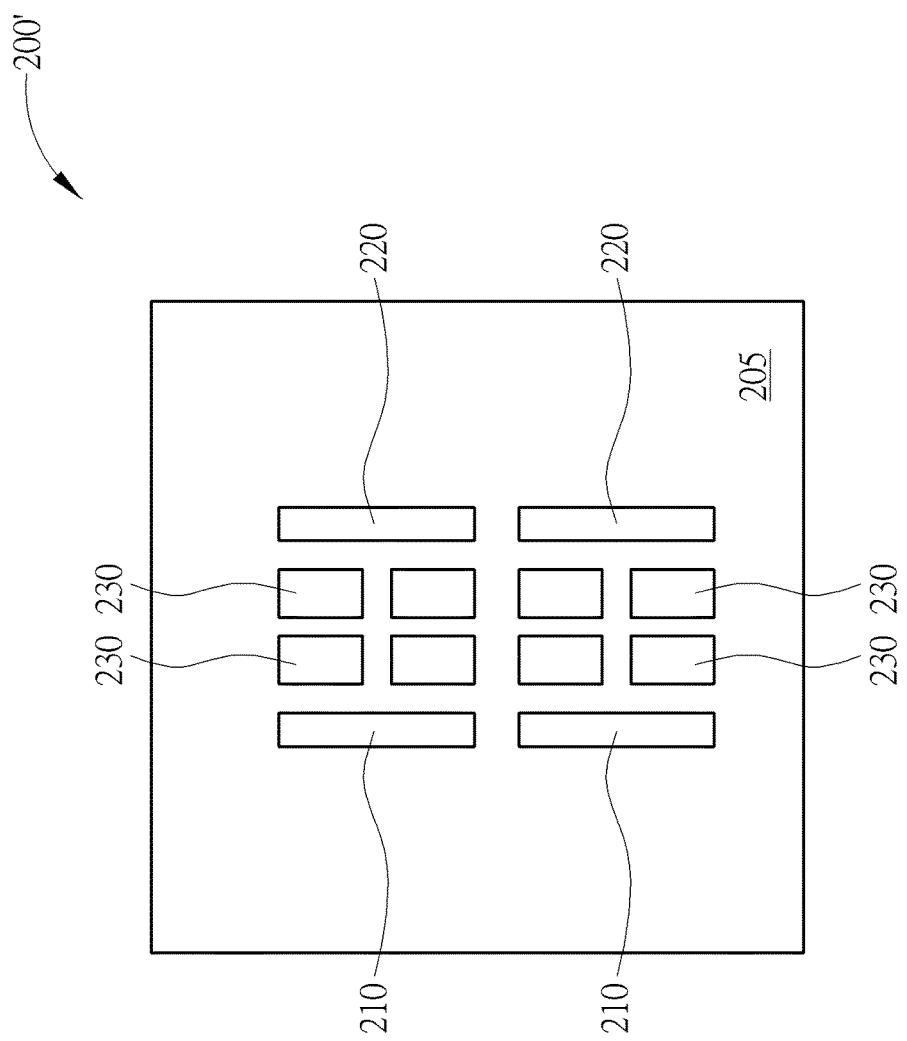
FIG. 4 is a diagram showing another embodiment of the lower surface of the light source carrier of the present invention.

Please refer to FIG. 4. FIG. 4 is a diagram showing another embodiment of the lower surface of the light source carrier of the present invention. As shown in FIG. 4, the light source carrier 200' of the present invention can comprise a plurality of first lower metal pads 210, a plurality of second lower metal pads 220, and a plurality of third lower metal pads 230. The plurality of first lower metal pads 210 can be electrically connected to the first upper metal pads through the plurality of first conductors respectively, in order to increase reliability of electrical connection between the first lower metal pads and the first upper metal pads. The plurality of second lower metal pads 220 can be electrically connected to the second upper metal pads through the plurality of second conductors respectively, in order to enhance reliability of electrical connection between the second lower metal pads and the second upper metal pads. The plurality of third lower metal pads 230 can be connected to the heat conduction area 376 of the circuit board 300 according to heat dissipation design.

Figure 5:
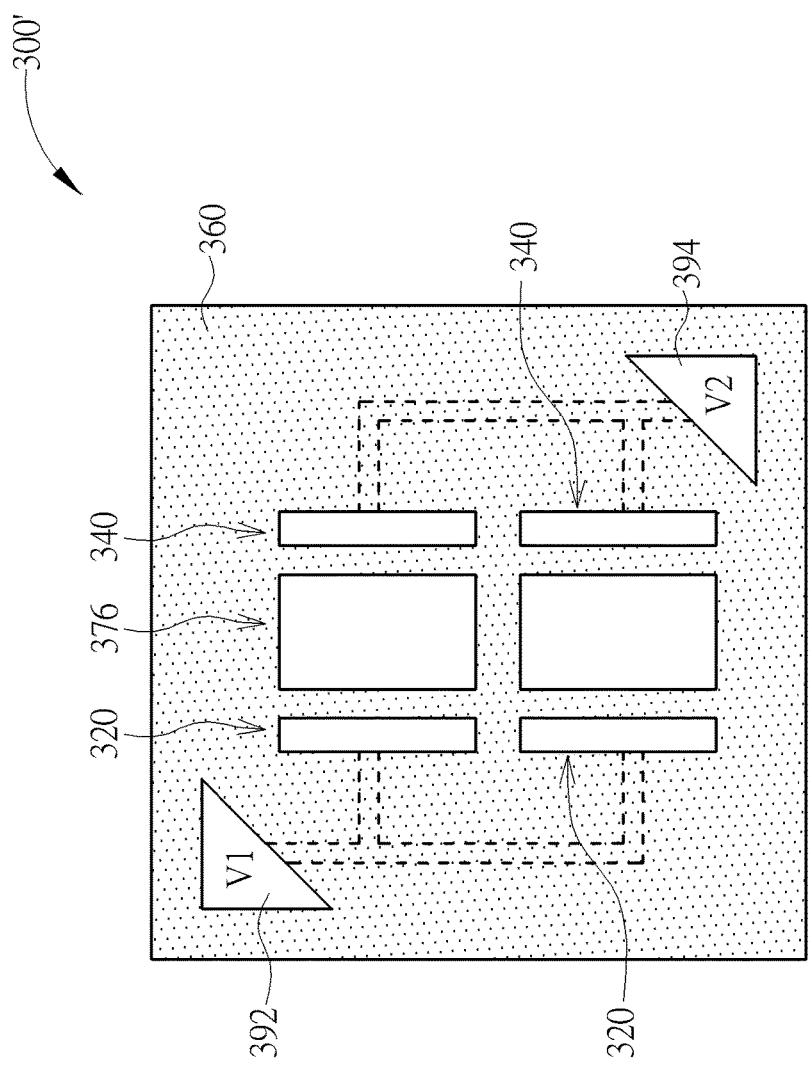
FIG. 5 is a diagram showing another embodiment of the upper surface of the circuit board of the present invention.

Please refer to FIG. 5. FIG. 5 is a diagram showing another embodiment of the upper surface of the circuit board of the present invention. As shown in FIG. 5, the circuit board 300' of the present invention can comprise a plurality of first metal electrodes 320 and a plurality of second metal electrodes 340. The plurality of first metal electrode 320 can be electrically connected to the corresponding first lower metal pads respectively, in order to increase reliability of electrical connection between the first metal electrodes and the first lower metal pads. The plurality of second metal electrode 340 can be electrically connected to the corresponding second lower metal pads respectively, in order to increase reliability of electrical connection between the second metal electrodes and the second lower metal pads.

In addition, layouts of the light source carrier and the circuit board of the present invention are not limited to the above embodiments. The layouts of the light source carrier and the circuit board of the present invention can vary according to design requirements.

In contrast to the prior art, the present invention utilizes the metal substrate as a circuit substrate of the light emitting device, and the metal substrate has an exposed heat conduction area connected to the third lower metal pad of the light source carrier. The light emitting device of the present invention can use the light source carrier to rapidly guide the heat generated by the light source when emitting light to the metal substrate through the heat conduction area for further dissipating the heat by the metal substrate. Therefore, the light emitting device of the present invention has better heat dissipation efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light emitting device, comprising:
   a light source having a first electrode and a second electrode;
   a light source carrier, comprising:
      an insulation substrate, with a first through hole and a second through hole formed on the insulation substrate;
      a first upper metal pad arranged on an upper surface of the insulation substrate and electrically connected to the first electrode;
      a second upper metal pad arranged on the upper surface of the insulation substrate and electrically connected to the second electrode;
      a first conductor arranged in the first through hole;
      a second conductor arranged in the second through hole;
      a first lower metal pad arranged on a lower surface of the insulation substrate and electrically connected to the first upper metal pad through the first conductor;
      a second lower metal pad arranged on the lower surface of the insulation substrate and electrically connected to the second upper metal pad through the second conductor; and
      a third lower metal pad arranged on the lower surface of the insulation substrate and not electrically connected to the first lower metal pad and the second lower metal pad; and
   a circuit board, comprising:
      a metal substrate having an upper surface and a lower surface, the upper surface of the metal substrate comprising a first electrode area, a second electrode area and a heat conduction area;
      a first metal electrode formed on the first electrode area for providing a first voltage to the first lower metal pad;
      a first insulation layer formed between the first metal electrode and the metal substrate;
      a second metal electrode formed on the second electrode area for providing a second voltage different from the first voltage to the second lower metal pad;
      a second insulation layer formed between the second metal electrode and the metal substrate; and
      a solder resist layer covering the upper surface of the metal substrate;
   wherein the heat conduction area is exposed from the solder resist layer, and the heat conduction area is connected to the third lower metal pad.

2. The light emitting device of claim 1, wherein the solder resist layer is made of a light reflective material.

3. The light emitting device of claim 1, wherein the heat conduction area is not electrically connected to the first metal electrode and the second metal electrode.

4. The light emitting device of claim 1 further comprising:
   a first power electrode electrically connected to the first metal electrode for receiving the first voltage; and
   a second power electrode electrically connected to the second metal electrode for receiving the second voltage.

5. The light emitting device of claim 1 further comprising:
   a first anti-oxidative metal layer formed on the first metal electrode; and
   a second anti-oxidative metal layer formed on the second metal electrode.

6. The light emitting device of claim 1, wherein the heat conduction area is connected to the third lower metal pad through a heat dissipation material.

7. The light emitting device of claim 1, wherein the first electrode area and the second electrode area are formed by etching the upper surface of the metal substrate.

8. The light emitting device of claim 1, wherein the light source is a flip-chip light emitting chip.

9. The light emitting device of claim 1, wherein the light source is an encapsulated light source.

10. The light emitting device of claim 1, wherein thermal conductivity of the heat dissipation material is greater than 50 W/mK.

11. The light emitting device of claim 1, wherein the solder resist layer is formed on the first metal electrode, and the solder resist layer directly contacts a side wall of the first metal electrode.

12. The light emitting device of claim 1, wherein the solder resist layer is formed on the first insulation layer.

13. The light emitting device of claim 1, wherein the solder resist layer directly covers a side wall of the first electrode area.

14. The light emitting device of claim 1, wherein the solder resist layer and the first metal electrode completely cover the first insulation layer.

15. The light emitting device of claim 1, wherein a width of the first metal electrode is smaller than a width of the first insulation layer.

16. The light emitting device of claim 1, wherein the solder resist layer is formed on the second metal electrode, and the solder resist layer directly contacts a side wall of the second metal electrode.

17. The light emitting device of claim 1, wherein the solder resist layer is formed on the second insulation layer.

18. The light emitting device of claim 1, wherein the solder resist layer directly covers a side wall of the second electrode area.

19. The light emitting device of claim 1, wherein the solder resist layer and the second metal electrode completely cover the second insulation layer.

20. The light emitting device of claim 1, wherein a width of the second metal electrode is smaller than a width of the second insulation layer.

* * * * *